(12) United States Patent
Rieger et al.

(10) Patent No.: US 10,229,957 B2
(45) Date of Patent: Mar. 12, 2019

(54) SEMICONDUCTING PARTICLES IN ELECTRONIC ELEMENTS

(71) Applicants: MERCK PATENT GMBH, Darmstadt (DE); YISSUM RESEARCH DEVELOPMENT COMPANY OF THE HEBREW UNIVERSITY OF JERUSALEM, LTD., Jerusalem (IL)

(72) Inventors: Bernhard Rieger, Muenster-Altheim (DE); Edgar Boehm, Griesheim (DE); Volker Hilarius, Gross-Umstadt (DE); Christof Pflumm, Darmstadt (DE); Uri Banin, Mevaseret Zion (IL)

(73) Assignees: MERCK PATENT GMBH, Darmstadt (DE); YISSUM RESEARCH DEVELOPMENT COMPANY OF THE HEBREW UNIVERSITY OF JERUSALEM, LTD., Jerusalem (IL)

( * ) Notice: Subject to any disclaimer, the term of this patent is extended or adjusted under 35 U.S.C. 154(b) by 0 days.

(21) Appl. No.: 15/548,607

(22) PCT Filed: Feb. 1, 2016

(86) PCT No.: PCT/EP2016/000160
§ 371 (c)(1),
(2) Date: Aug. 3, 2017

(87) PCT Pub. No.: WO2016/124324
PCT Pub. Date: Aug. 11, 2016

(65) Prior Publication Data
US 2018/0006092 A1 Jan. 4, 2018

(30) Foreign Application Priority Data

Feb. 4, 2015 (EP) .................................... 15000327
Mar. 4, 2015 (EP) .................................... 15000619

(51) Int. Cl.
*H01L 29/18* (2006.01)
*H01L 27/32* (2006.01)
(Continued)

(52) U.S. Cl.
CPC ............ *H01L 27/322* (2013.01); *C09K 11/02* (2013.01); *C09K 11/883* (2013.01); *G02B 5/206* (2013.01); *H01L 27/3213* (2013.01); *H01L 27/3244* (2013.01); *B82Y 20/00* (2013.01); *B82Y 40/00* (2013.01); *G02B 2207/101* (2013.01); *G02F 2001/01791* (2013.01); *G02F 2001/133614* (2013.01); *G02F 2202/101* (2013.01); *G02F 2202/102* (2013.01); *G02F 2202/106* (2013.01); *G02F 2202/107* (2013.01); *G02F 2202/36* (2013.01); *H01L 2251/5369* (2013.01); *Y10S 977/774* (2013.01); *Y10S 977/813* (2013.01); *Y10S 977/816* (2013.01);
(Continued)

(58) Field of Classification Search
None
See application file for complete search history.

(56) References Cited

U.S. PATENT DOCUMENTS

2008/0036367 A1 2/2008 Eida et al.

OTHER PUBLICATIONS

International Search Report for PCT/EP2016/000160 dated May 9, 2016.

*Primary Examiner* — Hung Vu
(74) *Attorney, Agent, or Firm* — Millen White Zelano and Branigan, PC; Csaba Henter (57) ABSTRACT

The present invention relates inter alia to a color display comprising nanoparticles and color filters.

23 Claims, 4 Drawing Sheets

(51) Int. Cl.
*C09K 11/88* (2006.01)
*G02B 5/20* (2006.01)
*C09K 11/02* (2006.01)
G02F 1/017 (2006.01)
G02F 1/1335 (2006.01)
B82Y 20/00 (2011.01)
B82Y 40/00 (2011.01)

(52) U.S. Cl.
CPC ........ *Y10S 977/818* (2013.01); *Y10S 977/819* (2013.01); *Y10S 977/82* (2013.01); *Y10S 977/824* (2013.01); *Y10S 977/892* (2013.01); *Y10S 977/95* (2013.01); *Y10S 977/952* (2013.01)

SEMICONDUCTING PARTICLES IN ELECTRONIC ELEMENTS

The present invention relates inter alia to a color display comprising nanoparticles as photoluminescent component.

Basically, there are two patterning approaches to realize a full color display comprising an organic electroluminescent device as light source.

The first approach comprises the separate deposition of organic electroluminescent layers for each of the colors red, green and blue (RGB emission), but manufacturing of such displays is rather complex.

The second approach is a red/green/blue (RGB) pattern, where red, green and blue pixels are laterally arranged on a substrate, and a vertical stack, which comprises an organic electroluminescent device that generates white light, in combination with a color filter to generate RGB colors is used. The most prominent example of an organic electroluminescent device employed for full color displays is an organic light emitting diode (OLED), but other organic electroluminescent devices such as organic light emitting electrochemical cells (OLECs) can, in principle, also be used. An OLED that emits white light is also called WOLED and the second approach is called WOLED-approach. The use of WOLED with color filter is particularly advantageous for large substrate processing and provides superior productivity due to the patternless OLED deposition.

Commonly used WOLED structures use a tandem design, where multiple emitting units are stacked vertically, which increases the complexity due to the requirement for additional process steps. Also the color performance generally is inferior as compared to the RGB emission method. Using color filters with narrow bandwidth allow to improve color performance, however lead to reduced light efficiency.

Object of the present invention is, thus, to remove the drawbacks of the prior art. Color displays are needed that are suitable for large substrate and large scale production and that exhibit improved color performance and high efficiency. While improving the above mentioned characteristics the structure of the organic electroluminescent device should be kept as simple as possible.

Surprisingly, it has been found that the problem can be solved by the use of both nanoparticles and color filter in color displays.

Figure 1A:
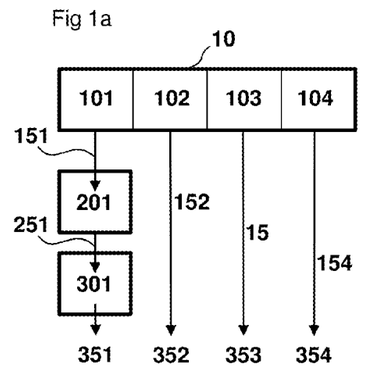

Thus, the present invention is related to an electronic element comprising
a) a pixelated organic electroluminescent device 100 comprising a first 101, a second 102, and a third 103 light emitting pixel that are identical, but that are electronically controlled separately;
b) a first color converter layer 201 disposed in the light output path 151 of the first pixel 101, wherein the color converter layer 201 comprises at least one light emitting semiconducting nanoparticle acting as first color converter;
c) a first color filter layer 301 disposed in the light output path 251 of the first color converter layer 201 comprising a first color filter.

FIG. 1a) depicts an electronic element comprising one color filter and one color converter layer.

In one embodiment of the present invention it is preferred if the first color converter layer 201 is located exclusively in the light output path 151 of the first pixel 101, i.e. the first color converter layer 201 is not in the light output path of the other pixels.

The intensity of the emitted light can be controlled electronically either by passive matrix or active matrix technology, preferably by active matrix technology.

The electronic element according to the present invention can also comprise scattering particles. Preferably the electronic element does not comprise any scattering particles.

The light source used in the electronic element is an organic electroluminescent device. Any known organic electroluminescent device can be used for the purpose of the present invention. Preferred organic electroluminescent devices are selected from the group consisting of organic light emitting transistors (OLETs), organic field quenching devices (OFQDs), organic light emitting electrochemical cells (OLECs, LECs, LEECs), organic laser diodes (O-Laser) and organic light emitting diodes (OLEDs), very preferably OLECs and OLEDs, particularly preferably OLEDs.

Preference is given to an electronic element as disclosed herein wherein the organic electroluminescent device is an active matrix device.

The term "OLED" includes both polymer light emitting diodes (PLEDs) and OLEDs comprising non polymeric small molecules. OLEDs according to the present inventions can also comprise both non-polymeric small molecules and polymers.

For the purpose of the present invention, the term "blue" is taken to mean a light having CIE (CIE 1931 RGB color space) color coordinates with CIE x being in the range from 0.0 to 0.25 and CIE y being in the range from 0.0 to 0.22 or CIE x being in the range from 0.0 to 0.2 and CIE y being in the range from 0.22 to 0.35.

For the purpose of the present invention, the term "green" is taken to mean a light having CIE (CIE 1931 RGB color space) color coordinates with CIE x being in the range from 0.1 to 0.45 and CIE y being in the range from 0.65 to 0.8 or CIE x being in the range from 0.24 to 0.45 and CIE y being in the range from 0.45 to 0.65.

For the purpose of the present invention, the term "red" is taken to mean a light having CIE (CIE 1931 RGB color space) color coordinates with CIE x being in the range from 0.55 to 0.75 and CIE y being in the range from 0.27 to 0.37.

For the purpose of the present invention, the term "bluish-green" is taken to mean a light having CIE (CIE 1931 RGB color space) color coordinates with CIE x being in the range from 0.00 to 0.25 and CIE y being in the range from 0.36 to 0.55.

For the purpose of the present invention, the term "white" is taken to mean a light having CIE (CIE 1931 RGB color space) color coordinates with
CIE x being in the range from 0.21 to 0,45 and
CIE y being in the range from 0.23 to 0.44,
preferably with
CIE x being in the range from 0.25 to 0.4 and
CIE y being in the range from 0.25 to 0.44,
very preferably with
CIE x being in the range from 0.3 to 0.4 and
CIE y being in the range from 0.3 to 0.44,
particularly preferably with
CIE x being in the range from 0.3 to 0.35 and
CIE y being in the range from 0.3 to 0.35,
very particularly preferably with
CIE x being in the range from 0.31 to 0.34 and
CIE y being in the range from 0.31 to 0.34,
and even more preferably with
CIE x being in the range from 0.32 to 0.34 and
CIE y being in the range from 0.32 to 0.34.

According to the present invention, the term "layer" includes "sheet" like structure.

According to the present invention the term "color filter" is taken to mean a material that absorbs light or irradiation, preferably the color filter absorbs visible light. One skilled in the art is well aware of color filters and can easily select the most appropriate one out of a large number of well known color filters. Preferably, the color filter is a dye, pigment or combination thereof.

Basically, any type of publically known dye and pigment for LCD color filter can be used in this way. Preferred examples of color filters are the ones as disclosed in "Technologies on LCD Color Filter and Chemicals" CMC Publishing P. 53 (1998)", azo-chelate pigments, fused azo pigments, quinacridone pigments, isoindolinone pigments, perylene pigments perinone pigments, insoluble azo pigments, phthalocyanice pigments, dioxazine pigments, anthraquinone pigments, thioin pigments or a combination of any of these.

According to the present invention, one of main requirements for the color filter is to absorb light that has been emitted by either the light source or if present from the color converter in order to improve color purity of light that is finally emitted by the electronic element.

Preferably the thickness of the color filter layer is in the range from 500 nm to 5 μm, very preferably from 800 nm to 3 μm and particularly preferably from 1 to 2 μm.

It is also preferably if the thickness of the color filter layer is in the range from 500 nm to 10 μm, very preferably from 750 nm to 7 μm and particularly preferably from 1 to 3 μm.

According to the present invention the term "color converter" is taken to mean a material that converts light or irradiation emitted by the organic electroluminescent device 100 into light or irradiation having a longer wavelength.

According to the present invention the term "light emitting semiconducting nanoparticle" is taken to mean an inorganic quantum sized material. Preferably the quantum sized material is either a quantum dot or a quantum rod or a combination thereof. However, the nanoparticle may also have no particular limit shape, but may be tetrapods, discs, prisms, spherical, rod-type, pyramidal or multi-armed, or also nanoplate type.

According to the present invention, the term "quantum sized" relates to the size of the material itself which can show the quantum size effect, but without ligands or another surface modification.

Generally, quantum sized material such as quantum dots and/or quantum rods can emit sharp vivid colored light.

The nanoparticles may be core/shell or core/multishell, doped or graded nanoparticles.

Both quantum dots and quantum rods can easily be produced and have a narrow emission spectrum (i.e. narrow spectral linewidth) in contrast to organic fluorescent or phosphorescent compounds. They can be tailored in terms of size which determines the quantum dot's or quantum rod's emission maximum. High photoluminescent efficiency can also be obtained with quantum dots and quantum rods. Furthermore their emission intensity can be tailored by their concentration employed. Moreover, quantum dots and quantum rods are soluble in many solvents or can easily be made soluble in common organic solvents, allowing versatile processing methods, particularly printing methods such as screen printing, off-set printing, and ink jet printing.

Preferably the quantum dot is selected from Group II-VI, Group III-V, Group IV-VI and Group IV semiconductors, particularly preferably from ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and a combination thereof.

Preferably, the quantum dot is a lead Perovskite based quantum dot, very preferably selected from the quantum dots as disclosed in L. Protesecu et al. (Nano Lett., 2015, 15, 3692-3696). Particularly preferred lead based quantum dots are selected from $CsPbI_3$, $CsPbBr_3$, $CsPbCl_3$, $CsPb(I/Br)_3$ and $CsPb(Br/Cl)_3$.

As a quantum dot, publically available quantum dot (hereafter "q-dot"), for example from Sigma-Aldrich, can be used preferably as desired.

Preferably, the diameter of the quantum dots are in the range between 1 to 20 nm, very preferably in the range between 1 and 10 nm and particularly preferably in the range between 2 and 7 nm.

In a preferred embodiment of the present invention, the quantum rod material can be selected from the group consisting of II-VI, III-V, or IV-VI semiconductors and combinations of any of these.

More preferably, the quantum rod material can be selected from the groups consisting of Cds, CdSe, CdTe, ZnS, ZnSe, ZnTe, ZnO, GaAs, GaP, GaAs, GaSb, HgS, HgSe, HgSe, HgTe, InAs, InP, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and combination of any of these.

For example, for red emission use, CdSe rods, CdSe dot in CdS rod, ZnSe dot in CdS rod, CdSe/ZnS rods, InP rods, CdSe/CdS rods, ZnSe/CdS rods or combination of any of these. For green emission use, such as CdSe rods, CdSe/ZnS rods, or combination of any of these, and for blue emission use, such as ZnSe, ZnS, ZnSe/ZnS core shell rods, or combination of any of these.

Examples of quantum rod material have been described in, for example, the international patent application laid-open No. WO2010/095140A.

In a preferred embodiment of the invention, the length of the overall structures of the quantum rod material is from 8 nm to 500 nm. More preferably, from 10 nm to 160 nm. The overall diameter of the said quantum rod material is in the range from 1 nm to 20 nm. More particularly, it is from 1 nm to 10 nm.

Preferably, the quantum sized inorganic semiconductor material such as quantum rod and/or quantum dot comprises a surface ligand. The surface of the quantum rod and/or quantum dot materials can be over coated with one or more kinds of surface ligands.

Without wishing to be bound by theory it is believed that such a surface ligands may lead to disperse the quantum sized inorganic semiconductor material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecyl-phosphonic acid (DDPA), Tridecylphosphonic acid (TDPA), Octadecyl-phosphonic acid (ODPA), and Hexylphosphonic acid (HPA); amines such as Dedecyl amine (DDA), Tetradecyl amine (TDA), Hexadecyl amine (HDA), and Octadecyl amine (ODA), thiols such as hexadecane thiol and hexane thiol; mercapto carboxylic acids such as mercapto propionic acid and mercaptoundecanoicacid; and a combination of any of these.

Other ligands custom made for specific purposes can also be used.

Examples of surface ligands have been described in, for example, the international patent application laid-open No. WO 2012/059931A.

Preferably the color converted is embedded in a matrix material in the color converter layer. As the matrix material, any type of publically known transparent matrix material preferable for optical films can be used as desired, but the matrix material should have good processability in fabrication of the color converter layer and long-term durability.

In a preferred embodiment of the present invention polymers can be used, particularly a photo-curable polymers, and/or photo-sensitive polymers. For example, acrylate resins used in LCD color filter, any photo-curable polysiloxane, a polyvinylcinnamate widely used as a photo-curable polymer or a combination of any of these.

For the purpose of the present invention the term "scattering particle" is taken to mean a material having different refractive index from the matrix material of the layer which includes the said light scattering particles and can give Mie scattering effects, can be used preferably as desired.

According to the present invention, as the light scattering particles, any type of publically known light scattering particles can be used.

For example, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; inorganic hollow oxides such as hollow silica, sulfates such as $BaSO_4$ or a combination of any of these; can be used preferably.

Preferably, the average particle diameter of the light scattering particles can be in the range from 350 nm to 5 μm.

Without wishing to be bound by theory, it is believed that more than 350 nm average particle diameter may lead to strong forward scattering caused by Mie scattering in a later, even if the refractive index difference between the light scattering particles and the layer matrix is as small as 0.1.

On the other hand, to obtain better layer forming properties by using the light scattering particles, maximum average particle diameter is 5 μm or less, preferably. More preferably, from 500 nm to 2 μm.

In a preferred embodiment the first color filter layer 301 comprises a red color filter as first color filter and the first color converter layer 201 comprises a red light emitting semiconducting nanoparticle as first color converter.

Figure 1B:
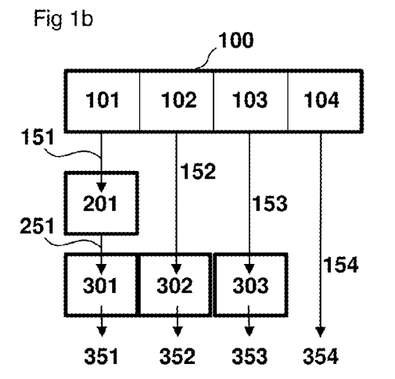

The electronic element can also comprise a second color filter layer 302 comprising a second color filter, wherein the second color filter layer is disposed in the light output path of the second pixel 102, preferably the second color filter is a green color filter (FIG. 1*b*)).

The electronic element can further comprise a third color filter layer 303 comprising a third color filter, wherein the third color filter layer is disposed in the light output path of the third pixel 103, preferably the third color filter is a blue color filter (FIG. 1*b*)).

Color filter and color converter for each pixel can be in two separate or in a single layer. Preference is given to two different layers for color converter and color layer. Further preference is given to a single layer comprising both the color converter and the color filter.

Figure 2:
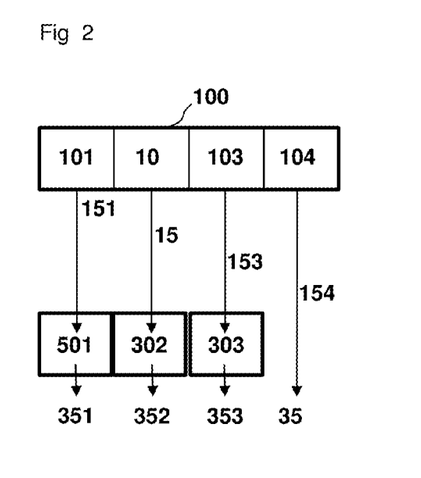
FIG. 2 shows an electronic device according to the present invention wherein the first color converting light emitting semiconducting nanoparticle and the first color filter are employed as composition in a single layer 501.

Thus, the present invention also relates to the electronic element as disclosed herein wherein the first color filter and the first color converter are located in the same layer as first combined layer 501 (FIG. 2).

Very preferably, the first combined layer comprising the first color converter and the first color filter exhibit a concentration gradient parallel to the light output path with respect to the concentration of the color converter.

Preferably the concentration of the color converter in the layer comprising both the color converter and the color filter is in the range between 10 mg/m$^2$ and 1 g/m$^2$, preferably between 20 mg/m$^2$ and 500 mg/m$^2$, very preferably between 50 mg/m$^2$ and 300 mg/m$^2$ and particularly preferably between 100 mg/m$^2$ and 200 mg/m$^2$ with respect to the total mass of the layer.

Figure 6:
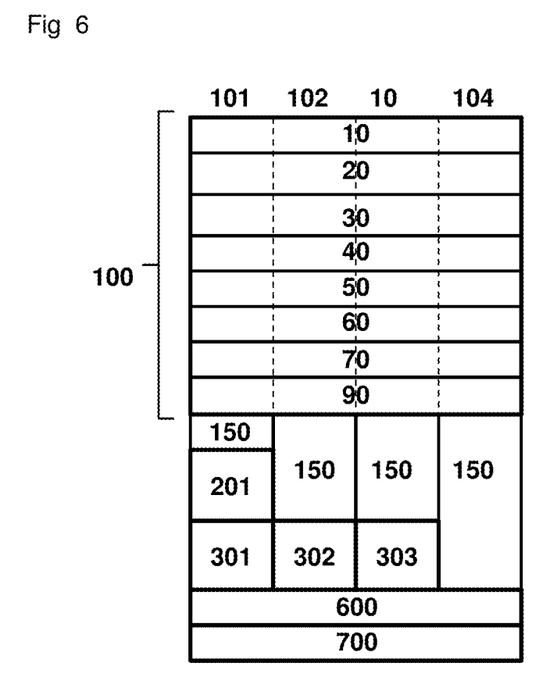
FIG. 6 depicts an example of a full color display comprising a pixelated tandem OLED as white light emitting organic electroluminescent device 100, wherein the numbers have the following meaning: 201—first color converter layer comprising at least one red light emitting semiconducting nanoparticle; 301—first color filter which is a red color filter; 302—second color filter which is a green color filter.

In a further preferred embodiment of the present invention the electronic element comprises a fourth pixel 104 (FIGS. 1, 2 and 6).

In a very preferred embodiment of the present invention the organic electroluminescent device 100 emits white light. This can be accomplished in different ways and one skilled in the art will have no problems to build an appropriate white light emitting organic electroluminescent device (e.g. S. Reineke et al., Reviews of Modern Physics 85, No. 3 (July 2013), 1245-1293).

Figure 3:
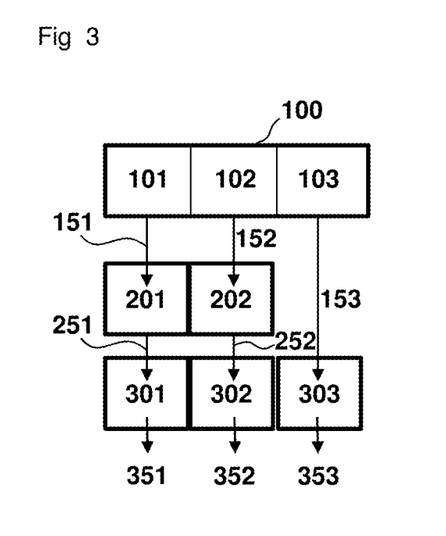
FIG. 3 shows another electronic device according to the present invention wherein a second color converter layer 202 is disposed in the light output path 152 of the second pixel 102. The second color filter layer 302 is disposed in the light output path 252 of the color converter layer 202.

Further preference is given to a second color converter layer 202 that is located in the light output path 152 of the second pixel 102 in between the second pixel 102 and the second color filter layer 302 (FIG. 3). Very preferably the second color converter is a light emitting semiconducting nanoparticle, particularly preferably the second color converter emits green light.

Figure 4:
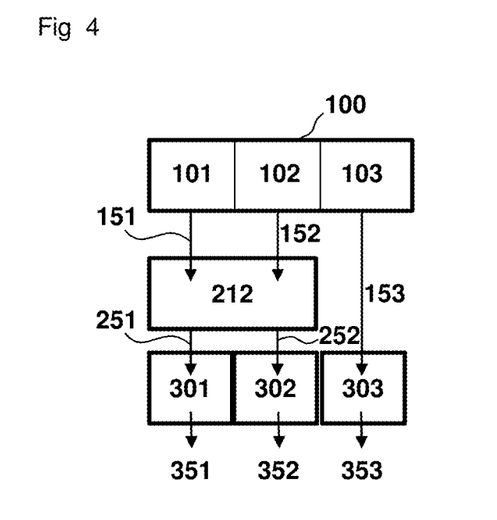
FIG. 4 shows a pixelated device according to the present invention having a common color converter layer 212 for the first and second pixel

The first color converter layer 201 and the second color converter layer 202 can also be represented by a single color converter layer 212 being disposed in the light output paths of the first 101 and the second 102 pixel, wherein the common color converter layer 212 comprises a composition of the first color converter and the second color converter (FIG. 4).

In another preferred embodiment the organic electroluminescent device of the electronic element emits blue light.

Figure 5:
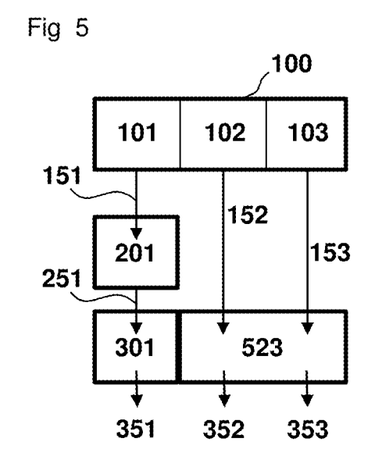
FIG. 5 shows another electronic device according to the present invention wherein a common color filter layer 523 is disposed in the light output paths 152 and 153 of the second and third pixel 102 and 103.

Furthermore, the second and third color filters can be located in a combined color filter layer 523 that is located in the light output paths of the second 152 and a third 153 pixel, wherein the common color filter layer 523 comprises a composition of the second and third color filter.

In yet another preferred embodiment the organic electroluminescent device of the electronic element emits bluish-green light.

Preferably the concentration of the light emitting semiconducting nanoparticle in the first, second or third color converter layer is in the range between 10 mg/m$^2$ and 1 g/m$^2$, very preferably between 20 mg/m$^2$ and 500 mg/m$^2$, particularly preferably between 50 mg/m$^2$ and 300 mg/m$^2$ and very particularly preferably between 100 mg/m$^2$ and 200 mg/m$^2$.

Preferably the electric element further comprises a planarization layer 150 between the pixelated organic electroluminescent device 100 and the color converter layer(s) or if no color converter layer is present between the pixelated organic electroluminescent device 100 and the color filter layer(s). Planarization layers are well known to one skilled person. One skilled in the art can easily select the most appropriate planarization layer, as planarization layers are typically employed in display technology.

The electronic element of FIG. 6 represents a particularly preferred embodiment of the present invention. The element comprises 4 pixels, a first color converter layer, a first, second and third color filter layer. Preferably the organic electroluminescent device 100 emits white light.

The electric element can be used for color displays in screens for, e.g., mobiles, laptops, televisions. Thus, the present invention also relates to a color display comprising at least one of the electronic elements according to the present invention.

Preferably the color display also comprises a TFT backplane 600.

Employing a red light emitting color converter as disclosed herein has several beneficial effects. The use of a red light emitting semiconducting nanoparticle in combination with a red color filter in color displays results in unexpectedly improved red light emission with beneficial color gamut and high power efficiency.

The present invention is also related to a composition comprising at least one red light emitting semiconducting nanoparticle and at least one red color filter. The composition can further comprise at least one scattering particle.

The present invention also relates to a layer comprising at least one light emitting semiconducting nanoparticle, preferably at least one red light emitting semiconducting nanoparticle, and at least one red color filter The performance data can be further improved by a specific preparation of the electronic element comprising quantum rods or core shell type quantum rods as color converter. Thus, the present invention also relates to a method for the preparation of the electronic element according to the present invention, comprising quantum rods or core shell type quantum rods or combinations thereof, characterized in that the color converter layer comprising the quantum rods or core shell type quantum rods is, at least in part, oriented, preferably by oriented deposition or by stretching before it is deposited onto the pixelated organic electroluminescent device. Any method can be used in order to orient the color converter layer. One skilled in the art has no difficulty to select the most appropriate method. The orientation of the color converter layer is particularly beneficial for the polarization of light, outcoupling of light and for brightness of the light.

The orientation can occur, e.g., via stretching (e.g. WO 2012/059931) or by using substrates that are pre-structured with notches.

Further techniques that are well known in the art can be used in order to polarize the emitted light or to improve out-coupling. Preferred methods to accomplish this are the ones disclosed in WO 2015/151092 A1 and WO 2015/198327 A1.

The resulting device possesses a specific structure that depends on the degree of structuring the color converter layer.

Thus, the present invention also relates to an electronic element obtained by the method as described above.

The color display according to the present invention is distinguished by the following surprising advantages over the prior art:
1. Devices according to the present invention show higher color purity as compared to devices according the prior art;
2. Devices according to the present invention show improved efficiency;
3. The devices according to the present invention can be prepared easily with low production costs;
4. The devices according to the present invention are particularly suitable for mass production;
5. The devices according to the present invention have longer lifetimes as compared to the devices according to the prior art.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the figures and following description of exemplary embodiments, which are given for illustration of the invention and are not intended to be limiting thereof.

Some of the above mentioned embodiments will be described in more detail in the following working examples with reference to the accompanying figures.

BRIEF DESCRIPTION OF THE FIGURES

FIG. 1 depicts in a) and b) different arrangements of an electronic device according to the present invention. The electronic device comprises an organic electroluminescent device 100 comprising a first pixel 101, a second pixel 102, a third pixel 103 and optionally a fourth pixel 104. The pixels emit the same light, but are electronically controlled separately. The device comprises in the light output path of the first pixel 151 a color converter layer 201 comprising a first light emitting semiconducting nanoparticle. In the light output path 251 of the first color converter layer 201 the electronic device further comprises a first color filter layer 301. The first color filter layer 301 finally emits light 351. The light output paths of the second 102, third 103 and fourth 104 pixels are denoted by 152, 153 and 154, respectively. Light emitted to the outside of the electronic devices either by the pixels directly or by color filter layers is denoted by 351, 352, 353 and 354. In b) a second color filter layer 302 and a third color filter layer 303 are disposed in the light output paths of the second pixel 102 and the third pixel 103, respectively.

303—third color filter which is a blue color filter; 10—cathode layer for the first second, third and (optional) fourth pixel; 20—electron transport layer (ETL) for the first, second, third and fourth pixel; 30—red/green or yellow light emitting emissive layer for the first, second, third and fourth pixel; 40—hole transport layer (HTL) for the first, second, third and fourth pixel; 50—charge generation layer for the first, second, third and fourth pixel; 60—blue light emitting emissive layer for the first, second, third and fourth pixel; 70—hole transport layer (HTL) for the first, second, third and fourth pixel; 90—anode (e.g. ITO) for the first, second, third and fourth pixel; 150—planarization layer; 600—TFT backplane:oxide, LTPS (low temperature polycrystalline silicon); 700—glass.

WORKING EXAMPLES

Example 1

Preparation of Light Emitting Semiconducting Nanoparticles
Preparation of CdSe Cores for red light emitting nanorods:
A 3 neck flask containing 0.06 g cadmium oxide, 0.28 g octadecyl-phosphonic acid (ODPA) and 3 g of trioctylphosphine oxide (TOPO) is degassed at 150° C. for an hour and a half. The selenium precursor is prepared in a glove box by dissolving 58 mg of elemental Se in 0.36 g of tri-n-octylphosphine (TOP) in a 20 mL vial. 1.5 g of TOP are put in a second vial. After degassing, the flask is flushed with argon, and heated to about 300° C., when an optical clarity is achieved. At this point 1.5 g TOP is slowly injected into the flask. The flask is further heated to 350° C., at which point, the TOP:Se is quickly injected into the flask. The reaction time depends on the desired size of the cores. The reaction is stopped by removing the heating source. The cores are dissolved and precipitated by 1:1 toluene:methanol mixture. In this first step, CdSe cores with diameter of 3.4 nm are synthesized.
Preparation of CdSe/CdS Red Light Emitting Nanorods:
A 3 neck flask containing 0.12 g cadmium oxide, 0.16 g hexaphosphonic acid (HPA), 0.56 g octadecylphosphonic acid (ODPA) and 3 g of trioctylphosphine oxide (TOPO) is degassed at 150° C. for an hour and a half. The sulfur precursor is prepared dissolving 0.12 g of elemental Sulfur in 1.5 g of tri-n-octylphosphine (TOP) in a 20 mL vial. 1.5 g of TOP are put in a second vial. The required amount of cores depends on the desired length of the nanorods. For 23 nm long rods, $2.3*10^{-7}$ mol of CdSe are needed. After the sulfur has dissolved, the TOP:S is poured onto the purified cores and mixed until complete dissolvent of the cores is achieved. After degassing, the flask is flushed with argon and heated to about 300° C., when an optical clarity is achieved. At this point 1.5 g TOP is slowly injected into the flask. The flask is further heated to 360° C., at which point, the TOP:S:CdSe is quickly injected into the flask. The reaction is allowed to stand for 8 minutes. The reaction is stopped by removing the heating source. The resulting nanorods synthesized using the CdSe cores with diameter of 3.4 nm described above have dimensions of 23×7 nm with an emission maximum at 628 nm and full width halve maximum (FWHM) of 24 nm when measured in a toluene solution.

Example 2

Preparation and Characterisation of Color Converting Films
Films which are not stretched are prepared following similar procedures to those disclosed in WO 2011/092646 (LIGHTING DEVICES WITH PRESCRIBED COLOUR EMISSION). Two different films are prepared, one scattering (called QFilm2) and one non-scattering (called QFilm1). The preparation of the nanorods used for preparing the films is described above.
Preparation of the Non-scattering Film (QFilm1):
A nanorod solution is prepared. For this, a certain amount of nanorods is added to 4 ml toluene. The amount is chosen so that when the solution is diluted 50 times, an optical density of 0.27 for a 10 mm path quartz cuvette at is obtained at 450 nm. Next, 1.1 g of of Poly(vinyl butyral-co-vinyl alcohol-co-vinyl acetate) (PVB), available e.g. from Sigma-Aldrich, is dissolved in 15 ml toluene. 25% of this PVB solution is added to the nanorod solution while stirring. The resulting solution of nanorods and PVB is placed on a 6 cm by 6 cm glass plate, inserted into a dessicator and vacuumed for 15 hours after which the mixture is solid and the resulting film can be removed from the glass plate.
Preparation of the Scattering Film (QFilm2):
The scattering film (QFilm2) is prepared in the same way with the exception that an additional 55 mg of $BaSO_4$ is added to the PVB solution. The Quantum Yield of the films is measured with a Hamamatsu Quantaurus QY C11347-11 and a value of 63% is obtained for the non-scatterring film, 66% for the scattering film. The optical density of the non-scattering film is measured using a Shimadzu UV-1800 spectrophotometer and a value of 1.28 is obtained.

Stretched films (called QFilm3) are prepared following the procedures described in WO 2012/059931, (POLARIZING LIGHTING SYSTEMS, Example 1) with a stretching ratio of 4. The films before stretching are prepared following the same procedure as describe above for the non-scattering film. The polarization ratio is obtained by dividing the intensity of the emission polarized parallel to the stretching axis by the emission perpendicular to the stretching axis. The stretched films of the example exhibit a polarization ratio of 2.7. The Quantum Yield of the films is measured with a Hamamatsu Quantaurus QY C11347-11 and a value of 64% is obtained. The optical density of the films is measured using Shimadzu UV-1800 spectrophotometer and a value of 0.75 is obtained.

Example 3

Device Fabrication and Characterization
Determination of Performance Data:
The current efficiency (in cd/A) is calculated from the luminance and the current density. The luminance is measured in forward direction with a calibrated photodiode. Electroluminescence spectra are recorded for a luminance of 1000 $cd/m^2$. CIE 1931 x and y color coordinates are calculated from these spectra. The external quantum efficiency (EQE, measured in percent) is calculated under the assumption of lambertian emission from a measurement of the current efficiency, voltage and the electroluminescence spectra for 1000 $cd/m^2$.

Figure 7:
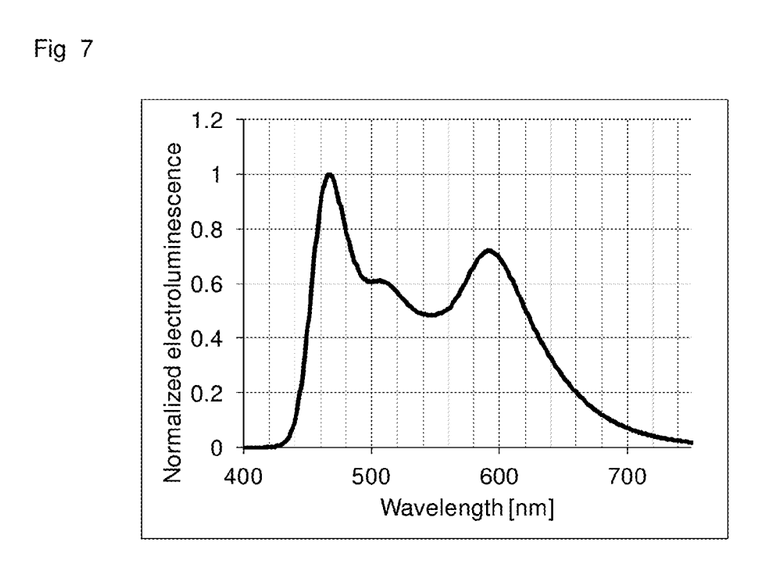
FIG. 7 shows the electroluminescence spectrum of the white OLED used in Example 3.

For the following examples, a white emitting OLED is used. The electroluminescence spectrum is shown in FIG. 7. The OLED has an EQE of 29.3%.

Figure 8:
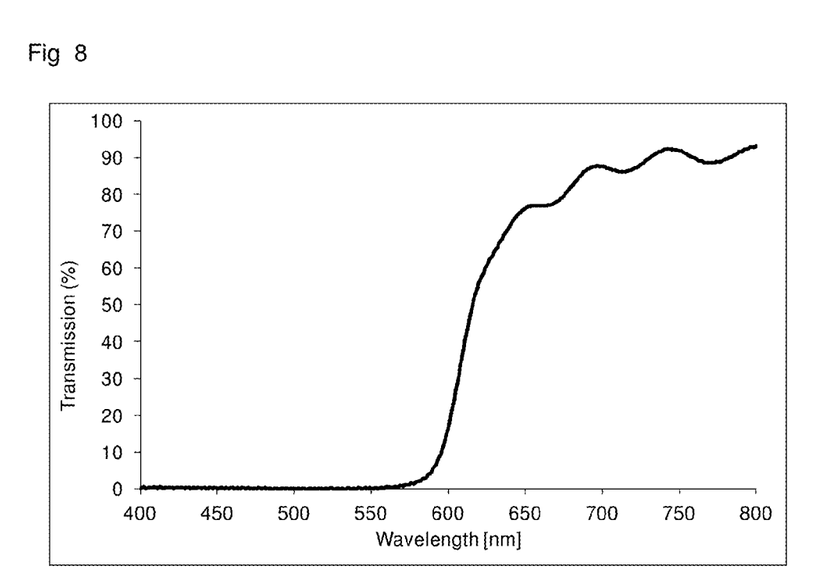
FIG. 8 shows transmission spectrum of the red color filter used in Example 3.

As comparative example according to the state of the art, a red color filter (Lee Filter 106, "Primary red") is put on the OLED. The transmission spectrum of the filter is shown in FIG. 8. As immersion oil between the OLED and the filter, $C_{14}H_{12}O_2$ is used. The resulting device shows red emission, CIE 1931 color coordinates x=0.67, y=0.32 and an EQE of 4.7%.

As inventive example, a film containing nanorods (QFilm) is put between the color filter and the OLED. $C_{14}H_{12}O_2$ is applied as immersion oil between the OLED and the QFilm and between the QFilm and the red color filter.

If the non scattering QFilm1 is used, the EQE increases to 7.1% which corresponds to a 50% improvement compared to the state of the art. The color coordinates of this device are x=0.68, y=0.32 and thus virtually identical to that of the device from the comparative example.

If the scattering QFilm2 is used, the EQE increases to 8.0% which corresponds to a 70% improvement. The color coordinates of this device are x=0.68, y=0.32 and thus almost identical to that of the device from the comparative example.

If the stretched, non scattering QFilm3 is used, the EQE increases to 5.8% which corresponds to an improvement of about 20%. The color coordinates of this device are x=0.68, y=0.32 and thus almost identical to that of the device from the comparative example.

If two instead of one QFilm3 are used and immersion oil is applied between the two films, the EQE increases to 6.3% which corresponds to an improvement of 35%. The color coordinates of this device are x=0.68, y=0.32 and thus virtually identical to that of the device from the comparative example.

The invention claimed is:

1. An electronic element comprising
   a) a pixelated organic electroluminescent device 100 comprising a first 101, a second 102, and a third 103 light emitting pixel that are identical, and are electronically controlled separately,
   b) a first color converter layer 201 disposed in the light output path 151 of the first pixel 101, wherein the color converter layer 201 comprises at least one light emitting semiconducting nanoparticle acting as first color converter;
   c) a first color filter layer 301 disposed in the light output path 251 of the first color converter layer 201 comprising a first color filter,
   and wherein the electronic element comprises scattering particles, which are $SiO_2$, $SnO_2$, CuO, CoO, $Al_2O_3$ $TiO_2$, $Fe_2O_3$, $Y_2O_3$, ZnO, or MgO particles, or organic particles of polymerized polystyrene or polymerized PMMA, or inorganic hollow oxide particles, or sulfate particles or a combination thereof.

2. The electronic element according to claim 1, wherein the first color filter layer 301 comprises a red color filter as first color filter and the first color converter layer 201 comprises a red light emitting semiconducting nanoparticle as first color converter.

3. The electronic element according to claim 1, wherein a second color filter layer 302 comprising a second color filter is disposed in the light output path of the second pixel 102.

4. The electronic element according to claim 1, wherein a third color filter layer 303 comprising a third color filter is disposed in the light output path of the third pixel 103.

5. The electronic element according to claim 1, wherein the first color filter and the first color converter are located in the same layer as first combined layer 501.

6. The electronic element according to claim 1, wherein the element further comprises a fourth pixel 104.

7. The electronic element according to claim 1, wherein the pixelated organic electroluminescent device emit white light.

8. The electronic element according to claim 1, wherein the device comprises in the light output path 152 of the second pixel 102 between the second pixel 102 and the second color filter layer 302 a second color converter layer 202 comprising a second color converter.

9. The electronic element according to claim 8, wherein the first color converter layer 201 and the second color converter layer 202 are represented by a single common color converter layer 212 being disposed in the light output paths of the first 101 and the second 102 pixel, wherein the common color converter layer 212 comprises a composition of the first color converter and the second color converter.

10. The electronic element according to claim 1, wherein the organic electroluminescent device emits blue light.

11. The electronic element according to claim 1, wherein the device comprises a common color filter layer 523 in the light output paths of the second 152 and a third 153 pixel, wherein the common color filter layer comprises a composition of the second and third color filter.

12. The electronic element according to claim 1, wherein the organic electroluminescent device emits bluish-green light.

13. The electronic element according to claim 1, wherein the concentration of the light emitting semiconducting nanoparticle in the first, second or third color converter layer is 10 mg/m² to 1 g/m².

14. The electronic element according to claim 1, wherein the light emitting semiconducting nanoparticle(s) is(are) selected from the group consisting of quantum dots, core shell type quantum dots, quantum rods, core shell type quantum rods and combinations thereof.

15. The electronic element according to claim 1, wherein the light emitting semiconducting nanoparticle(s) is(are) selected from the group consisting of InGaP, CdSe, CdS, CdTe, ZnO, ZnSe, ZnS, ZnTe, HgSe, HgTe, CdZnSe, InP, InN, GaN, InSb, InAsP, InGaAs, GaAs, GaP, GaSb, AlP, AN, AlAs, AlSb, CdSeTe, ZnCdSe, PbSe, PbTe, PbS, PbSnTe, and $Tl_2SnTe_5$ and combinations thereof.

16. The electronic element according to claim 1, wherein the color filters are selected from dyes and pigments.

17. The electronic element according to claim 1, wherein the device further comprises a planarization layer 150 between the pixelated organic electroluminescent device 100 and the color converter layer(s) or if no color converter layer is present between the pixelated organic electroluminescent device 100 and the color filter layer(s).

18. A color display comprising the electronic element according to claim 1.

19. The color display according to claim 18, which comprises a TFT backplane 600.

20. A method or preparing the electronic element according to claim 1, wherein the color converter layer comprising the quantum rod, core shell type quantum rod or combination thereof is, at least in part, oriented.

21. An electronic element obtainable according to the method of claim 20.

22. The electronic element according to claim 1, wherein the average particle diameter of the scattering particles is 350 nm to 5 µm.

23. The electronic element according to claim 1, wherein the scattering particles are $SiO_2$, $SnO_2$, CuO, CoO, $Al_2O_3$, $TiO_2$, $Fe_2O_3$, $Y_2O_3$, ZnO, or MgO particles, or organic particles of polymerized polystyrene or polymerized PMMA, or hollow silica particles or $BaSO_4$ particles or a combination thereof.

* * * * *

UNITED STATES PATENT AND TRADEMARK OFFICE
CERTIFICATE OF CORRECTION

PATENT NO. : 10,229,957 B2
APPLICATION NO. : 15/548607
DATED : March 12, 2019
INVENTOR(S) : Bernhard Rieger It is certified that error appears in the above-identified patent and that said Letters Patent is hereby corrected as shown below:

In the Claims

Column 12, Line 43 Claim 15 reads:
"AN, AlAs, AlSb, CdSeTe, ZnCdSe, PbSe, PbTe, PbS,"
Should read:
--AlN, AlAs, AlSb, CdSeTe, ZnCdSe, PbSe, PbTe, PbS,--

Signed and Sealed this
Seventeenth Day of September, 2019

Andrei Iancu
*Director of the United States Patent and Trademark Office*